United States Patent [19]

Thompson et al.

[11] Patent Number: 5,257,026

[45] Date of Patent: Oct. 26, 1993

[54] METHOD AND APPARATUS FOR CALIBRATING A MULTI-BIT DELTA-SIGMA MODULAR

[75] Inventors: Charles D. Thompson; Salvador R. Bernadas; Nicholas R. van Bavel, all of Austin, Tex.; Eric J. Swanson, Buda, Tex.

[73] Assignee: Crystal Semiconductor, Inc., Austin, Tex.

[21] Appl. No.: 870,270

[22] Filed: Apr. 17, 1992

[51] Int. Cl.$^5$ .............................................. H03M 1/06
[52] U.S. Cl. .................................... 341/118; 341/143; 364/724.10
[58] Field of Search ....................... 341/118, 143, 120; 364/724.01, 724.04, 724.10

[56] References Cited

U.S. PATENT DOCUMENTS

| | | | |
|---|---|---|---|
| 4,225,963 | 9/1980 | Ferrieu | 375/28 |
| 4,775,851 | 10/1988 | Borth | 341/155 |
| 4,852,035 | 7/1989 | Michener | 364/724.10 |
| 4,893,264 | 1/1990 | Noll et al. | 364/724.10 |
| 4,943,807 | 9/1990 | Early et al. | 341/120 |
| 4,972,360 | 11/1990 | Cukier et al. | 341/143 X |
| 4,977,403 | 12/1990 | Larson | 341/143 |
| 4,999,627 | 3/1991 | Agazzi | 341/118 X |
| 5,134,402 | 7/1992 | Miyoshi | 341/143 X |
| 5,153,593 | 10/1992 | Walden et al. | 341/143 |

OTHER PUBLICATIONS

"Adaptive Selfcalibrating Delta-Sigma Modulators" by S. Abdennadher, S. Kiaei, G. Temes and R. Schreier, Electronics Letters, Jul. 2, 1992, vol. 28, No. 14.
"On-Line Adaptive Digital Correction of Dual-Quantisation Delta-Sigma Modulators" by Yaohua Yang, R. Schreier, G. C. Temes and S. Kiaei, Electronics Letters, Jul. 30, 1992, vol. 28, No. 16.

Primary Examiner—Howard L. Williams
Attorney, Agent, or Firm—Gregory M. Howison

[57] ABSTRACT

A calibration method and apparatus to calibrate for non-linearities in a multi-level delta-sigma modulator (12) includes a calibration multiplexer (10) on the input for selecting in a calibration mode a zero voltage for input to the delta-sigma modulator (12). The delta-sigma modulator (12) has three levels, +1, 0, −1, the +1 level input to a processor (32) and the −1 level input to a processor (34). The processor (34) has the output thereof input to an compensation circuit (14) that offsets the value generated by the −1 processor (34) by a coefficient δ. The output of the compensation circuit (14) is then input to the minus input of a summation junction (36), which also receives the output of the processor (32), the output of summation junction (36) providing the digital output. The processors (32) and (34) are realized with a separate accumulator that switches between an associated filter coefficient and ground, the filter coefficient stored in a ROM (35). The δ coefficient is stored in a block (16) and is generated during a calibration cycle by a δ processor (39). The δ processor (39) receives the output of the compensation circuit (14) and the digital output from the summing junction (36) when the calibration multiplexer (10) sets the input to zero. A control circuit (40) controls the overall operation, with the calibration operation initiated in response to either an external signal on a line (30) or an internally generated signal. After calibration, the value of the δ coefficient is frozen and the calibration multiplexer (10) selects the analog input.

33 Claims, 7 Drawing Sheets

METHOD AND APPARATUS FOR CALIBRATING A MULTI-BIT DELTA-SIGMA MODULAR

TECHNICAL FIELD OF THE INVENTION

The present invention pertains in general to analog-to-digital converters, and more particularly, to a calibration system for calibrating for non-linearities in the delta-sigma analog modulator and the analog-to-digital converter.

CROSS-REFERENCE TO RELATED APPLICATIONS

This application is related to U.S. patent application Ser. No. 07/870,059, entitled "Delta-Sigma Modulator for an Analog-to-Digital Converter with Low Thermal Noise Performance", filed concurrently herewith.

BACKGROUND OF THE INVENTION

High order delta-sigma analog-to-digital converters have a number of noise sources, offsets, etc. that deter the overall performance thereof, especially when resolving very small input voltage levels. DC offsets and gain errors have been sources of error in such ADCS, and these errors have been addressed with self-calibration systems, such as that disclosed in U.S. Pat. No. 4,943,807, issued to Early on Jul. 24, 1990. Another source of error is the non-linearity of the delta-sigma modulator, which is due in part to the feedback DAC.

The non-linearity of the feedback DAC is of more concern in a multilevel output delta-sigma modulator, as compared to a one-bit delta-sigma modulator. The one-bit modulator requires only a two-state feedback, which is inherently linear. However, the one-bit modulator does have one disadvantage in that, when the input signal is near mid-scale, large amounts of error are added to the loop during each sampling period. By utilizing a multi-level modulator, and one or more additional DAC levels, the state of the feedback DAC when the input voltage is near mid-scale is a "do nothing" state, which minimizes quantizing error RMS voltage. Such a DAC topology is disclosed in J. J. Paulos, G. T. Brauns, M. B. Steer and S. H. Ardalan, "Improved Signal-To-Noise Ratio Using Tri-Level Delta-Sigma Modulation", *IEEE Proceedings ISCAS*, pp. 463–466, May 1987.

One disadvantage to a multi-level feedback DAC is that the multi-level feedback no longer provides the inherent linearity of two states, as was the case in a one-bit modulator. In general, the feedback DAC in a multi-level delta-sigma modulator must be linear to the full accuracy of the overall converter. Adjusting even a third feedback state to part-per-million accuracy can be difficult. Careful selection of resistors has been attempted for audio applications, as disclosed in R. W. Adams, "Design and Implementation of an Audio 18-Bit Analog-to-Digital Converter Using Oversampling Techniques", *J. Audio Eng. Soc.* Vol. 34, pp. 153–166, March 1986. Another technique utilizes dynamic element matching with a dithering of imprecise DAC elements to convert linearity error into noise, which has been disclosed in L. R. Carley, "A Noise-Shaping Coder Topology for 15+ Bit Converters", *IEEE J. Solid-State Circuits*, Vol. SC-24, pp. 267–273, April 1989.

These previous techniques suffer a number of disadvantages in that reconfigurations of analog circuit topologies and changes in digital control waveforms are generally undesirable in any self-calibrated architecture. Digital interference coupled into analog circuitry can be removed by calibration, but any differences in interference between the calibration mode and the normal operation mode result in errors not removed by calibration. Therefore, there exists a need for a calibration system that calibrates for the non-linearities in a multi-level feedback DAC prior to utilizing the traditional delta-sigma calibration procedures to eliminate overall gain and offset errors.

SUMMARY OF THE INVENTION

The present invention disclosed and claimed herein comprises a method and apparatus for compensating for non-linearities in an analog-to-digital converter having a multi-level output delta-sigma modulator. The delta-sigma modulator is an m-level output with m greater than two, the output of which is input to a digital filter. The digital filter operates in accordance with filter coefficients stored in a memory. The memory is also operable to store non-linearity compensation parameters. The operation of the digital filter is controlled to compensate for the non-linearities that exist in the delta-sigma modulator during the operation of the digital filter.

In another aspect of the present invention, the digital filter is driven with the m-level output of the delta-sigma modulator. The compensation device is operable to compensate $m-2$ of the m-levels that are utilized to drive the digital filter in accordance with the stored non-linearity parameters. In the preferred embodiment, the value of m is equal to three.

In yet another aspect of the present invention, the multi-level output of the delta-sigma modulator is comprised of a $-1$ level, a "do nothing" level and a $+1$ level. The filter is comprised of first and second processors for processing the $+1$ level and $-1$ level, respectively, each of the processors for receiving the stored filter coefficients and providing a set of accumulated filter coefficients that are accumulated as a function of the associated level being output from the delta-sigma analog modulator. A summation device is operable to receive the output of the first and second processors and sum the difference therebetween. The compensation device compensates the output of one of the first and second processors in accordance with the stored non-linearity compensation parameters prior to summation with the summation device.

In a further aspect of the present invention, a calibration device is provided for determining the non-linearity parameters in response to receiving a calibration signal. The calibration device is operable to change the operation mode from a normal operation mode to a calibration mode. In the calibration mode, the non-linearity parameters are determined and then stored in the memory. Thereafter, the system is returned back to a normal operation mode.

In a yet further aspect of the present invention, the calibration device is comprised of a calibration multiplexer for driving the input with a zero input level. A non-linearity adaptive processor is provided for comparing the output of the digital filter with a desired value to define an error. An iteration is performed wherein the non-linearity compensation parameters are iterated for a time sufficient to drive the error below a predetermined value. The non-linearity parameters are then stored in the memory.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
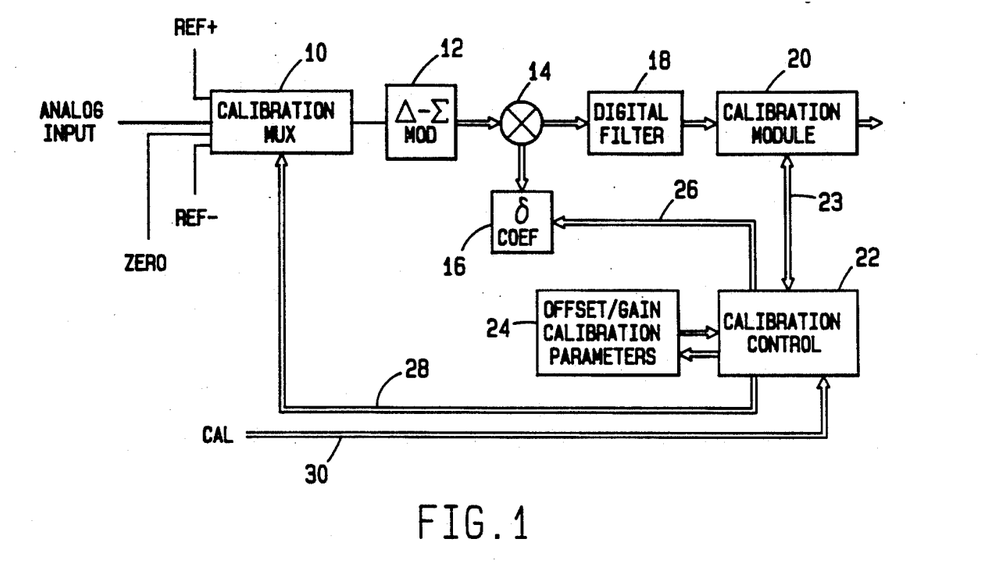
FIG. 1 illustrates a general block diagram of a calibrated analog-to-digital converter providing for self-calibration of non-linearities in the delta-sigma modulator.

Referring now to FIG. 1, there is illustrated a detailed block diagram of an overall analog-to-digital converter utilizing calibration for gain and offset errors and also calibration for non-linearities in a multi-bit delta-sigma modulator. A calibration multiplexer 10 is provided that is operable to receive an analog input signal and three reference voltages, a positive reference voltage, a negative reference voltage and a zero reference voltage. The positive and negative reference voltages are utilized for the overall gain and offset calibration and the zero reference voltage is utilized for the non-linearity calibration, as will be described in more detail hereinbelow. The output of the multiplexer 10 is input to the input of the delta-sigma modulator 12 which provides on the output thereof a multi-level output. In the preferred embodiment, the output is a two-bit output having three levels, +1, 0, −1.

The output of the delta-sigma modulator 12 is input to a compensation circuit 14 that is operable to pass through the levels +1 and 0 and to calibrate for the −1 output level with a $\delta$ offset coefficient. The $\delta$ offset coefficient is stored a $\delta$ coefficient block 16, which constitutes a register, and this is input to the compensation circuit 14 for use in the normal operation mode, as will be described in more detail hereinbelow. The output of the compensation circuit 14 is input to a digital filter 18, which is typically a Finite Impulse Response (FIR) filter. In the preferred embodiment, as will be described hereinbelow, the compensation circuit 14 and the digital filter 18 are combined.

The output of the digital filter 18 is input to a calibration module 20 which is operable to calibrate for gain and offset errors in accordance with U.S. Pat. No. 4,943,807, issued to Early on Jul. 24, 1990, which patent is incorporated herein by reference. The calibration module 20 is controlled by a calibration control circuit 22, which is connected thereto by a bi-directional bus 23. The calibration module 20 under the control of calibration control circuit 22 is operable to determine the offset/gain calibration parameters and store them in a block 24, which constitutes a memory. During normal operation, these parameters are utilized by the calibration module to perform the actual offset and gain correction. The calibration control 22 also controls the calibration operation that is utilized to generate the $\delta$ coefficient in the block 16 through the bus 26, as will be described hereinbelow. The calibration multiplexer 10 is controlled by the calibration control 22 for all calibration operations, and is connected thereto by a bus 28. Further, the calibration control 22 can run in an automatic mode which, in the preferred embodiment, occurs on a power-up sequence. Further, an external calibration signal can be received through a control line 30 to allow the calibration operation to periodically occur in response to external stimuli. Since the parameters of the high-resolution analog-to-digital converter will vary as a function of time, temperature, etc., it is necessary to periodically recalibrate the system.

Figure 2:
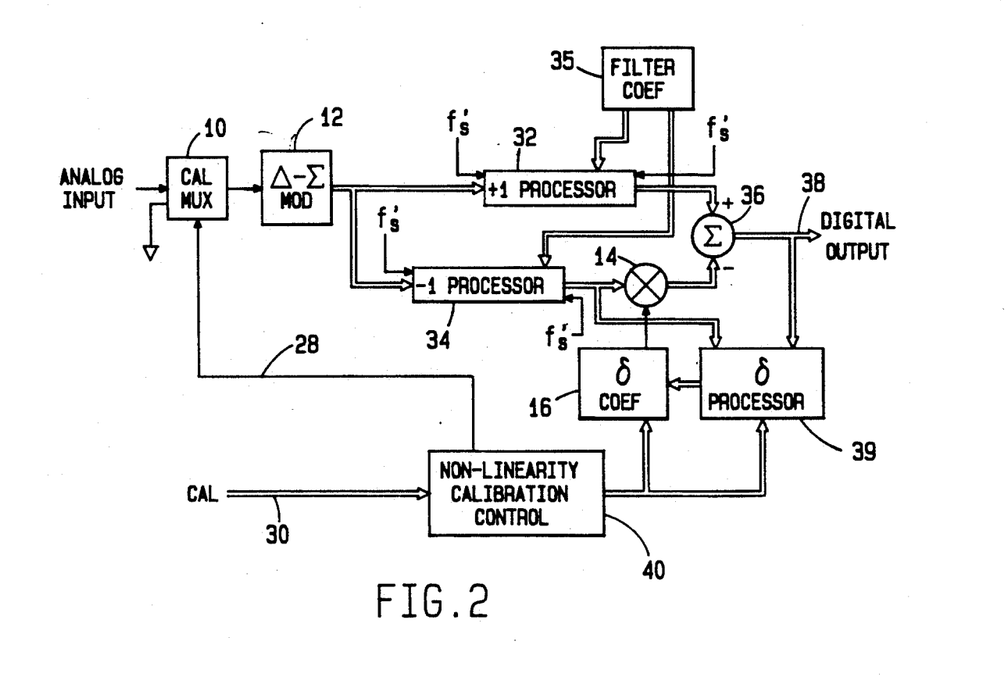
FIG. 2 illustrates a detailed block diagram of the portion of the calibration system utilized to calibrate out non-linearities in the delta-sigma modulator.

Referring now to FIG. 2, there is illustrated a block diagram of the portion of the calibration operation that is directed toward calibrating for the non-linearities in the delta-sigma modulator 12. The output of the delta-sigma modulator 12 is input to a +1 processor 32 and also to a −1 processor 34. The output of the processor 32 is input to the positive input of a summing junction 36. The output of the −1 processor 34 is input to the compensation circuit 14, the value of which is offset by the $\delta$ coefficient in block 16. This compensated value is then input to the minus input of the summing junction 36. The output of the summing junction 36 provides the overall digital output on a bus 38 representing the digital output of the decimation filter. The filter coefficients for the processors 32 and 34 are stored in a filter coefficient memory 35, which is typically a ROM.

During calibration, a non-linearity calibration control circuit 40 is provided, which is an integral part of the calibration control circuit 22. The non-linearity calibration control circuit 40 is operable to control the calibration multiplexer 10 to select a ground or zero input. The digital output on the digital bus 38 is then input to a $\delta$-processor 39 which utilizes an iterative technique to minimize the error. When the error has been minimized, the value of $\delta$ is then frozen in the $\delta$ coefficient block 16 for normal operation. It can be seen that this calibration operation occurs outside of the delta-sigma modulator 12 such that calibration is not circuit dependent. Further, it will be seen that with m-levels, only m−2 levels need to be compensated for. In the present embodiment, with three levels, only one of the levels, the −1 level, needs to be compensated for in order to remove the non-linearities.

Figure 3:
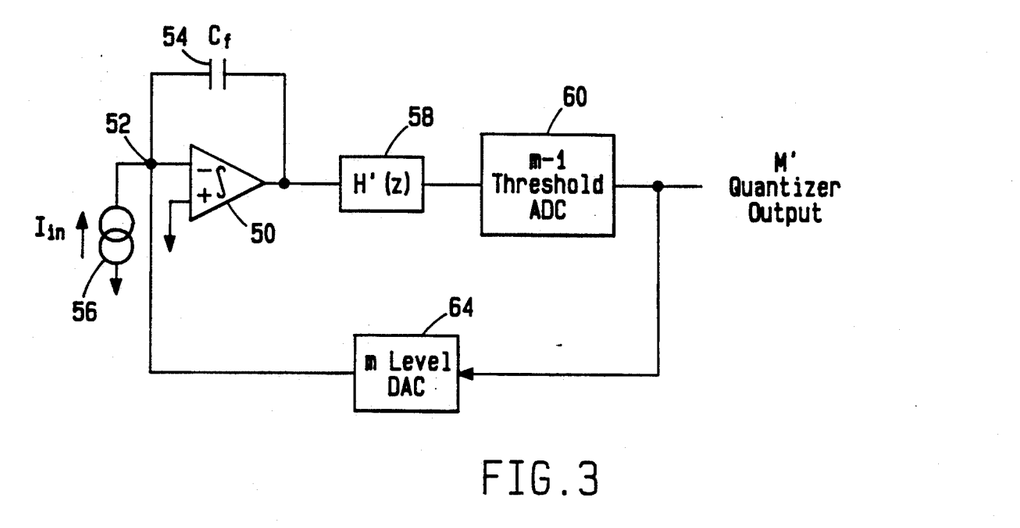
FIG. 3 illustrates a block diagram of the general m-bit delta-sigma modulator.

Referring now to FIG. 3, there is illustrated a block diagram of an m-level delta-sigma modulator. The delta-sigma modulator is comprised of an input integration stage 50 having a positive and a negative input, the positive input connected to ground and the negative input connected to a summing node 52. A feedback capacitor 54 is connected between the input node and the output of the integrator 50. A current source 56 provides the input to the analog-to-digital converter. However, it should be understood that a voltage input could be utilized with the addition of an input digital switched-capacitor. The output of the integrator 50 is connected to the input of a noise shaping circuit 58 which is typically comprised of a plurality of integrators, as will be described hereinbelow. The noise shaping circuit 58 has a transfer function H'(z). The output of the noise shaping circuit 58 is connected to an input of a (m−1)-threshold imbedded analog-to-digital converter (ADC) 60.

The output of the imbedded ADC 60 is also connected to the control input of an m-level digital-to-analog converter (DAC) 64. The m-level DAC provides three normalized levels, +1, 0 and −1, with the "0" level providing "do nothing" level. The m-level DAC 64 has associated therewith a plurality of output voltages to define various feedback levels, with an additional "do nothing" output.

Figure 4:
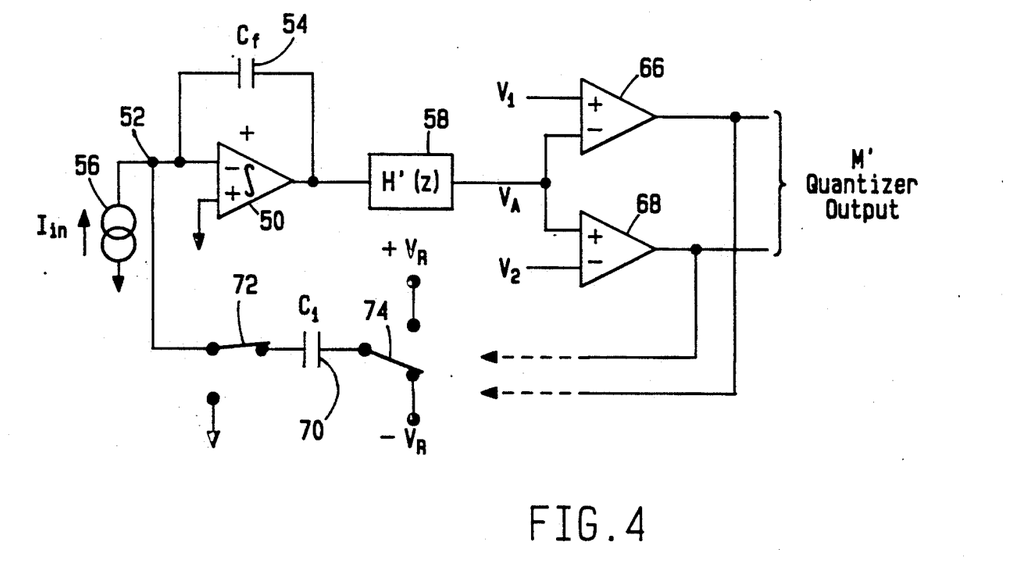
FIG. 4 illustrates a more detailed block diagram of a three-level delta-sigma modulator utilizing a three-level feedback DAC.

Referring now to FIG. 4, there is illustrated a more detailed block diagram of the delta-sigma modulator of FIG. 3, illustrating a two-bit output providing three states. The imbedded ADC 60 is comprised of two comparators, a comparator 66 and a comparator 68. The comparator 66 has the positive input thereof connected to a threshold voltage $V_1$, and the negative output thereof connected to the output of the noise-shaping circuit 58. The comparator 68 has the positive input thereof connected to the output of the noise-shaping circuit 58 and the negative input thereof connected to a threshold voltage $V_2$. The outputs of the two comparators 66 and 68 comprise the two-bit output that is input to the digital filter 18 and also to the DAC 64. Therefore, when the voltage $V_A$ on the noise-shaping circuit 58 is less than $V_1$ and greater than $V_2$, the output state is a "11" state, whereas the output state when $V_A$ is greater than $V_1$, is a "01" state and the output state when $V_A$ is less than $V_2$ is a "10" state. This provides three separate states. However, the "do nothing" state is the first state, wherein the output is "11".

The DAC 64 is comprised of a switched-capacitor 70 that has one terminal thereof connected to the wiper of a switch 72, switch 72 connectable between ground and the input node 52. The other plate of capacitor 70 is connected to the wiper arm of a switch 74, switch 74 operable to switch between reference voltages $-V_R$ and $+V_R$. The switches are controlled such that the "do nothing" state exists whenever the switch 72 is grounded for a full sampling period. The "+1" state exists whenever the capacitor 70 is charged with the switch 74 configured to contact the reference voltage $-V_R$ and the switch 72 grounded in a first phase of the sampling period. Then, both switches 72 and 74 are switched in a second phase of a sampling period. In the "−1" state, the capacitor 70 is charged up by connecting switch 72 to ground and switch 72 to $+V_R$ in a first phase of the sampling period. Then, switches 72 and 74 are switched in a second phase of the sampling period.

Figure 5:
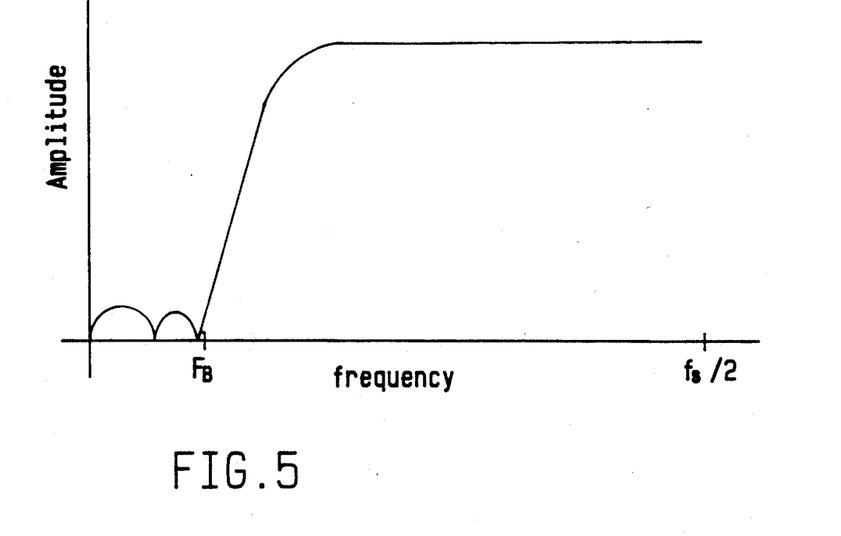
FIG. 5 illustrates the output spectrum for the ideal modulator.

Referring now to FIG. 5, there is illustrated a frequency response diagram illustrating the output spectrum for an ideal modulator. It can be seen that the noise levels are significantly reduced within the band of interest, between 0 to a corner frequency of $f_B$. The noise level then goes up significantly.

Figure 6:
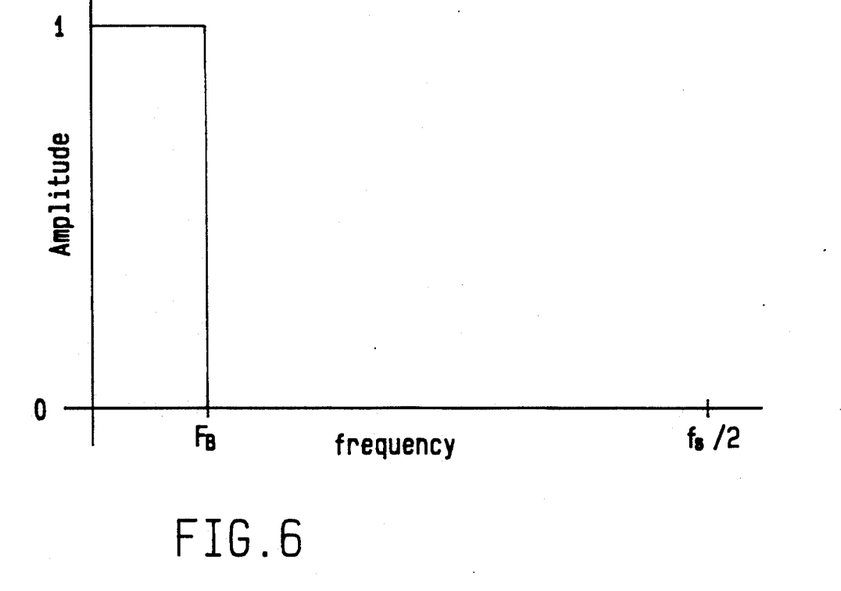
FIG. 6 illustrates the digital filter response for the modulator output spectrum of FIG. 5.

Referring now to FIG. 6, there is illustrated a frequency plot of the digital filter response which, as can be seen from the plot, is a very sharp brick wall filter that has a sharp roll-off at $f_B$. Therefore, the band of interest up to frequency $f_B$ is primarily passed-through with all spectral content above $f_B$ substantially filtered out. This is a conventional filtering technique for analog-to-digital converters utilizing a FIR filter.

Figure 7:
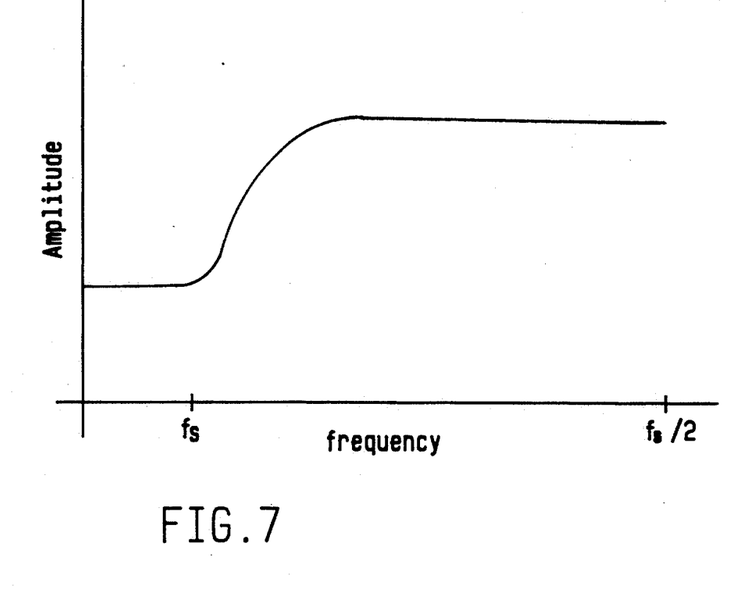
FIG. 7 illustrates the non-ideal modulator output spectrum.

Referring now to FIG. 7, there is illustrated the frequency response for a non-ideal modulator output spectrum. It can be seen that the frequency between zero and $f_B$ is significantly higher than that with the ideal response of FIG. 5. This is due to thermal noise and feedback DAC non-linearity errors. The system of the present invention removes those errors due to non-linearities in the feedback DAC.

Figure 8:
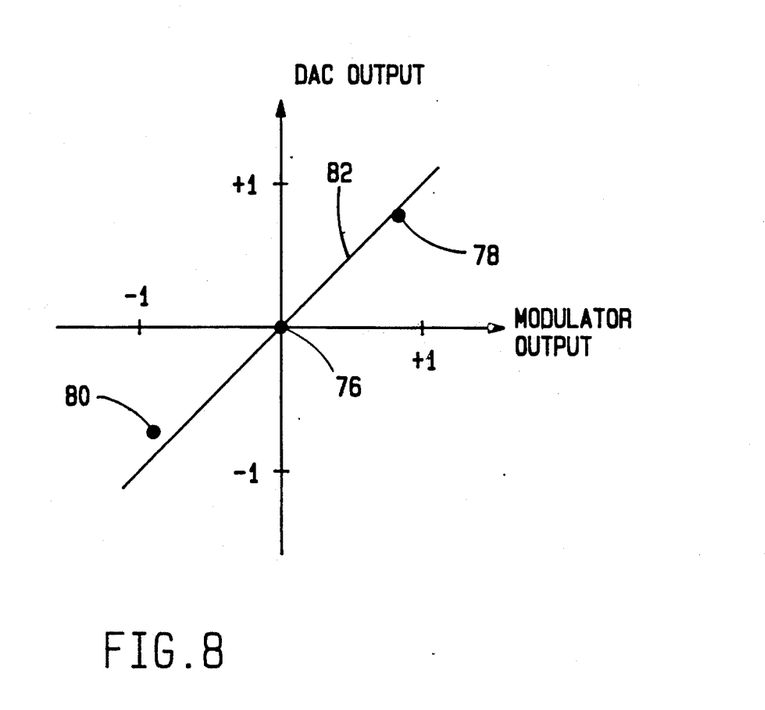
FIG. 8 illustrates the plot of the DAC output and the modulator output for the non-ideal DAC.

Referring now to FIG. 8, there is illustrated a diagram of the DAC output versus the modulator output, representing the three states of the tri-level delta-sigma modulator 12. The "0" or "do nothing" state is represented by a point 76 that is at the intersection of the two axis. This situation occurs for a case where gain and offset errors have been compensated for. The "+1" state is represented by a point 78 with the "−1" state being represented by a point 80. It can be seen that the points 76, 78 and 80 are not on a straight line, the straight line path being represented by a line 82. Since there are two points that will inherently exhibit linearity, it is only necessary to define the linear relationship with two points, such as points 76 and 78, which then defines the line 82. The point 80 deviates from the straight line path by a small amount, this representing the non-linearity in the delta-sigma modulator 12.

In accordance with the present invention, rather than driving the digital filter with levels of "−1", "0" and "+1", the digital filter is driven with the levels "δ", "0" and "+1". The parameter δ is adjusted during a calibration procedure with the modulator input held at the "0" level. The parameter δ is adjusted until the quantization noise at the digital filter output is minimized. Simulations of the delta-sigma modulator have revealed that the optimal noise is achieved when the δ parameter precisely compensates the linearity error of the feedback DAC. Therefore, no a priori knowledge of the DAC non-linearity is required.

Figure 9:
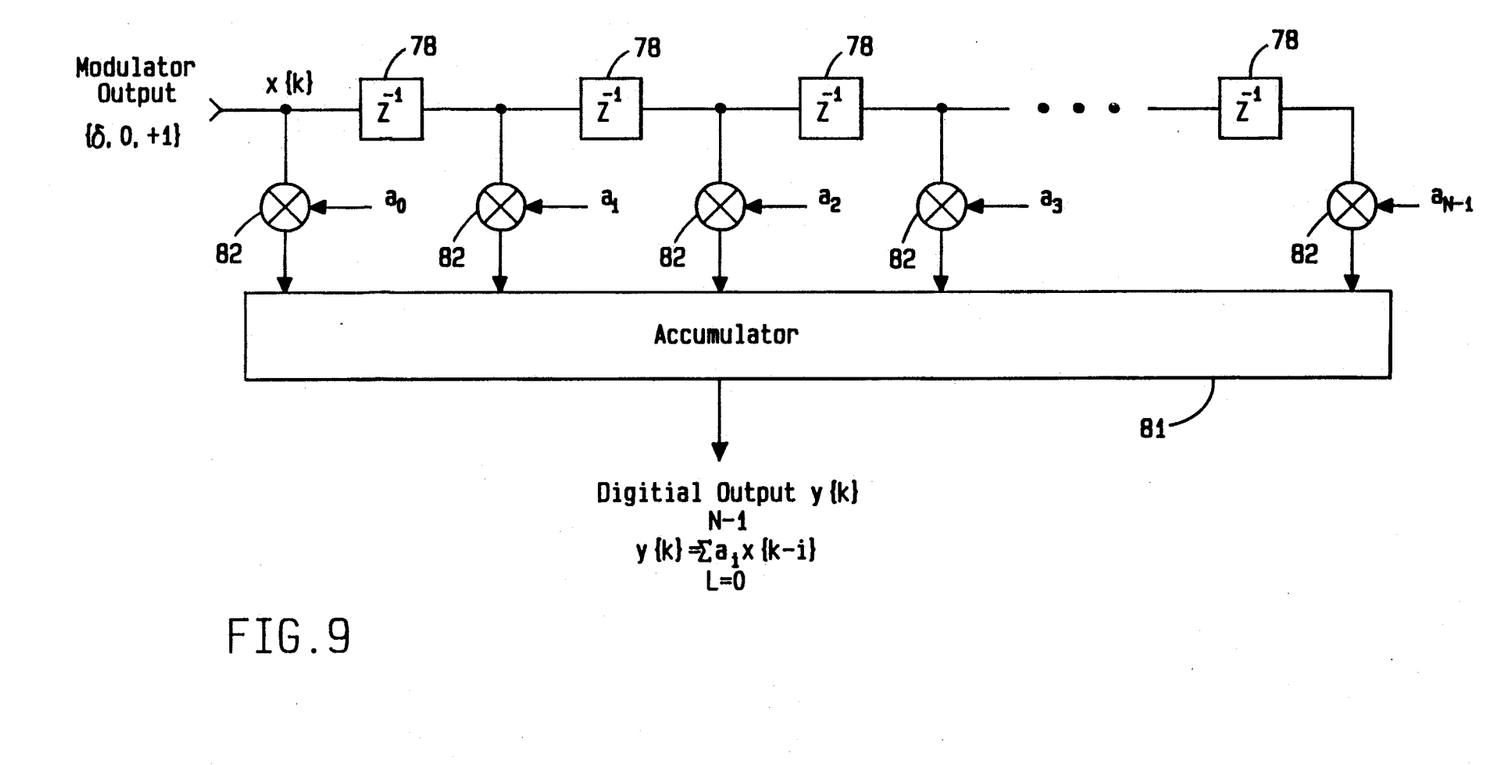
FIG. 9 illustrates a conventional decimation filter driven by a multilevel delta-sigma modulator.

Referring now to FIG. 9, there is illustrated a block diagram of a conventional FIR decimation filter that is driven with the modulator output levels "δ", "0" and "+1", which levels must model the imperfect feedback levels of the modulator DAC. Note that the value of "δ" must be known to the full resolution of the analog-to-digital converter and that precision on the order of 20-bits may be required for high resolution applications. The filter is comprised of a plurality of delays or delay blocks 78 having the transfer function $z^{-1}$. The input x(k) is input to the first of the delay blocks 78 with the input x(k) and the output of each of the delay blocks input to an accumulator 81 through multiplication blocks 82 to multiply each of the outputs of the delay blocks 78 and the input x(k) by one of N filter coefficients $a_0$ through $a_{N-1}$. The digital output y(k) is represented by the following equation:

$$y(k) = \sum_{i=0}^{N-1} a_i x(k-i)$$

The filter of FIG. 9 is a conventional filter and it only requires generation of the value of δ for the purpose of driving the digital filter. The tap weights $\{a_i\}$ define the decimation filter transfer function. The tap weights are typically stored in a ROM, and high quality decimation filters can require coefficient precision in excess of 20-bits. Therefore, a hardware multiplier of 20×20-bits is required. However, in most integrated FIR filters, the multiply/accumulate function is timemultiplexed to reduce hardware. In the filter illustrated in FIG. 9, multiplications are required at a frequency of $N*f_s/M$, wherein N is the number of filter taps and M is the decimation ratio.

Figure 10:
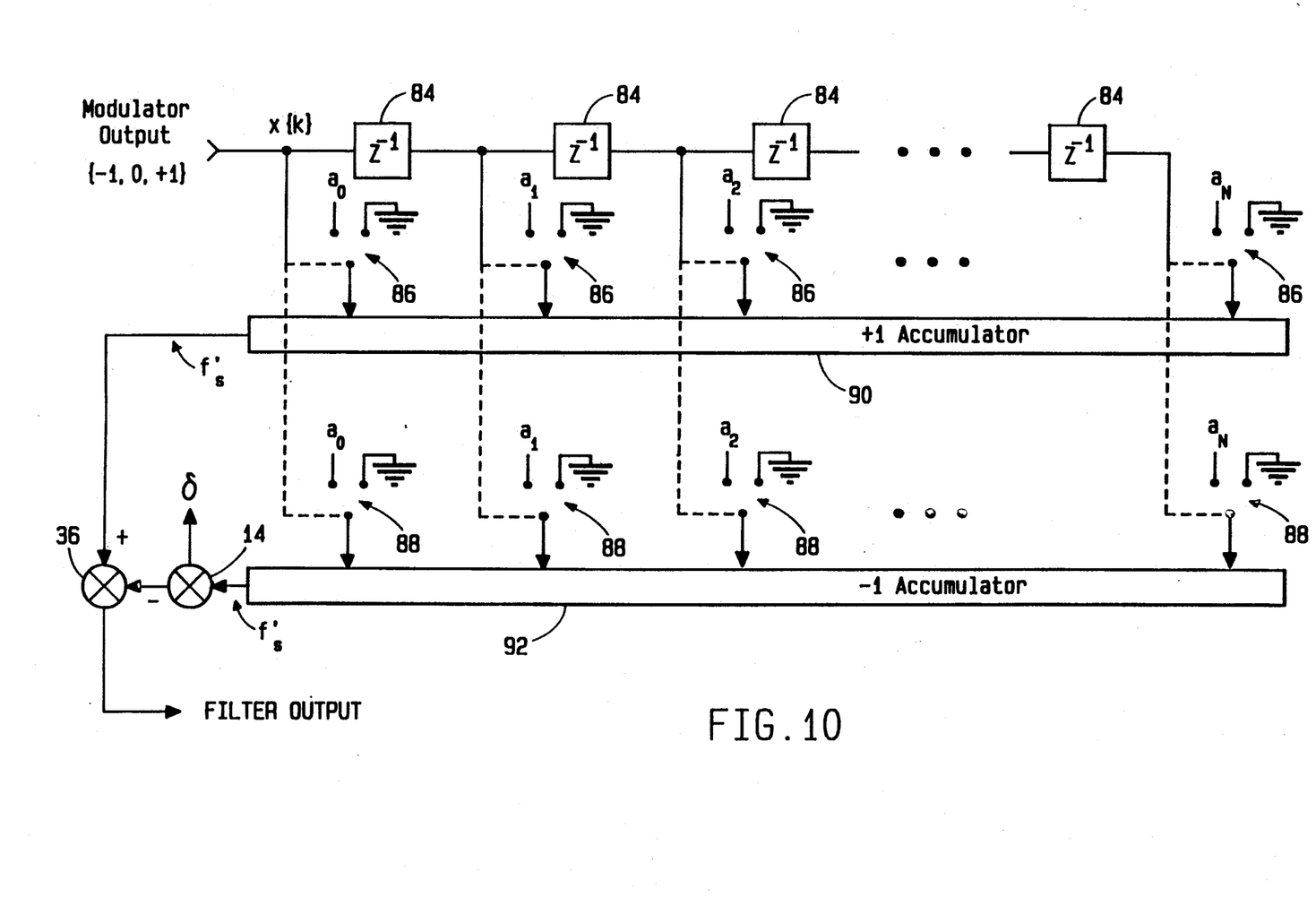
FIG. 10 illustrates the preferred embodiment of the decimation filter.

Referring now to FIG. 10, there is illustrated a multiplierless decimation filter that is the preferred embodiment of the present invention. This type of system was first disclosed in J. J. van der Kam, "A Digital 'Decimaling' Filter for Analog-to-Digital Conversion for High-Fi Audio Signals", *Philips Tech. Rev.* 42, No. 6/7, pp. 230-238, April 1986. By utilizing this type of structure, the system will avoid the need for a hardware multiplier ($a_i*\delta$), at the oversampled rate. This is done by commutating the operations of $\delta$-scaling and decimation filtering.

The input signal x(k) is input to a cascaded series of delay blocks 84, the outputs of which are each input to one of two switches 86 and 88, x(k) also input to one of two switches 86 and 88 for control thereof. The switches 86 and 88 are controlled to receive on the input thereof a tap weight $a_0$ through $a_N$ or ground. The input signal x(k) is a modulator output having the levels "−1", "0" and "+1". The "+1" level controls the switches 86 and the "−1" level controls the operation of switches 88 to switch between ground and the tap weight (filter coefficient). The output of each of the switches 86 is connected to a +1 accumulator 90 and the output of each of the switches 88 is input to one of a plurality of taps of a −1 accumulator 92. Therefore, if the delay line data is a "+1" level, the corresponding coefficient is added to the +1 accumulator and nothing is added to the "−1" accumulator 92. If the delay line data is "−1" level, the corresponding coefficient is added to the −1 accumulator 92 and nothing is added to the +1 accumulator 90. If the data is "0" level, neither accumulator 90 or 92 adds in anything. The switches 86 and the accumulator 90 comprise the +1 processor 32 and the switches 88 and accumulator 92 comprise the −1 processor 34 illustrated in FIG. 2.

The output of accumulator 90 is input to the positive input of the summing junction 36 and the output of accumulator 92 is input to the compensation circuit 14, the output of which is input to the negative input of the summing junction 36. The tap weights $a_0$ through $a_N$ are stored in the filter coefficient block 35, which is typically a ROM. The $\delta$ correction is applied at the decimated output rate ($f_s'$), which is a much lower frequency than the sampling frequency $f_s$, typically $f_s' > 2f_B$. The compensation circuit 14 is a relatively straightforward bit-serial multiply-accumulate engine.

Figure 11:
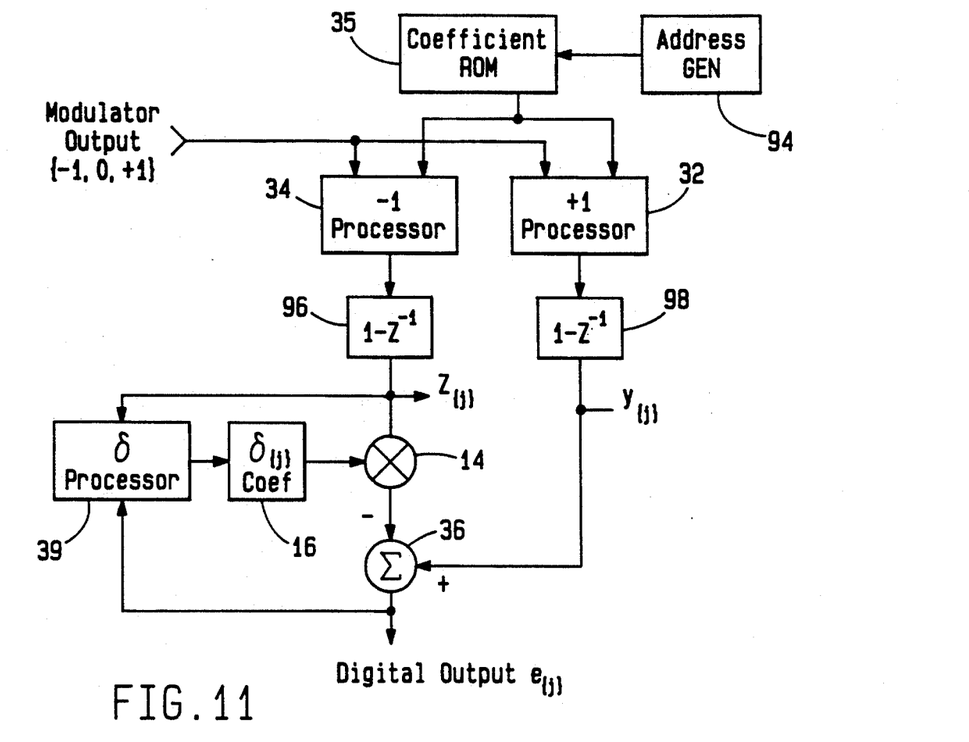
FIG. 11 illustrates a block diagram for the overall calibration operation in the digital filter section.

Referring now to FIG. 11, there is illustrated a block diagram illustrating the processors 32 and 34 in the calibration operation. The coefficients stored in the coefficient ROM 35 are controlled by an address generator 94 that ensures that the right coefficient operates on the right data at the right time. Two differentiator blocks 96 and 98 are provided, the differentiator block 96 connected between the output of the −1 processor 34 and the input to the compensation circuit 14, and the differentiator block 98 disposed between the output of the +1 processor 32 and the positive input of a summation junction 36. Each of the differentiator blocks 96 and 98 have a transfer function of $1-z^{-1}$. The differentiator blocks 96 and 98 prevent DC offsets from interfering with the calibration operations. These blocks are bypassed after calibration is completed.

The calibration operation utilizes the $\delta$ processor 39 that receives the output of the differentiator block 96, z(j), and also the output of the summation block 36. The $\delta$ processor 39 utilizes an iterative process to generate the $\delta_j$ coefficient for storage in the $\delta$ coefficient block 16.

The calibration procedure utilizes an iterative method to find the value of $\delta$ that minimizes the digital output e(j). The output is called e(j) during calibration because the modulator input is set equal to zero, such that anything present at the filter output represents noise and/or modulator error. The value of $\delta$ in $(j+1)^{th}$ iteration, $\delta_{j+1}$, is changed from its value in the $j^{th}$ iteration $\delta_j$, in accordance with the following relationship:

$$\delta_{j+1} = \delta_j + \beta z(j)e(j)$$

In this equation, $\delta$ controls the speed at which $\delta$ converges to its final value and also determines the robustness of convergence in the presence of noise. Small values of $\delta$ enhance noise immunity, but increase calibration time. Clearly, $\delta$ converges to a constant value ($\delta_{j+1} = \delta_j$) as e(j) is driven to zero. The convergence effectively minimizes noise in the frequency band of interest caused by DAC non-linearities.

The topology described with reference to FIG. 11 filters out the high frequency noise from e(j), noise at frequencies above $f_B$. The use of low-pass filtering required during normal operation greatly reduces e(j) and provides for a better and faster convergence of $\delta$. In general, the bandwidth of the low pass filter during calibration can actually be lower than the bandwidth during conversion to further reduce e(j) and enhance conversion. However, increased filter complexity must be added, although the increased complexity is not required during normal operation.

Although the system has been described utilizing a three-level delta-sigma modulator and a three-level feedback DAC, multi-parameter iterative searches can be utilized for delta-sigma modulator systems with values of m that are greater than three in the feedback DAC levels. This would require m−2 adjustable parameters to remove digital errors for an m-level DAC.

Figure 12:
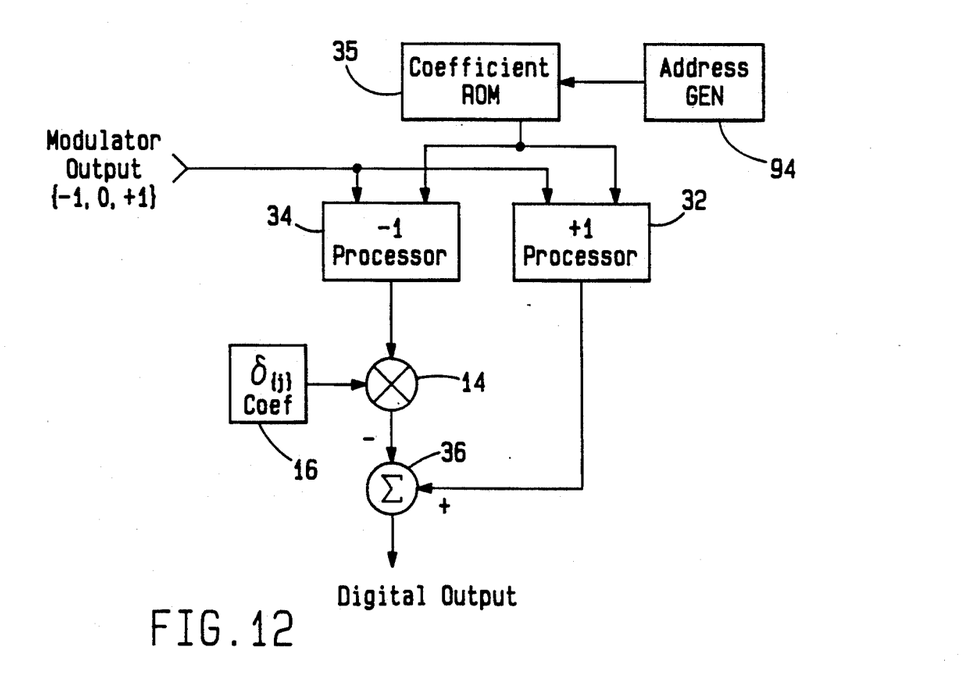
FIG. 12 illustrates the normal operation after the value of $\delta$ has been set.

The iterative process for determining $\delta_j$, is described in Widrow and Stearns, "Adaptive Signal Processing", *Prentice-Hall*, Englewood Cliffs, N.J., 1985, Chapter 1. After the iterative search has been performed, the modulator input signal is released from zero with the calibration multiplexer 10, the value of $\delta$ is frozen, and the differentiator blocks 96 and 98 are bypassed. This results in the topology illustrated in FIG. 12. The excess in-band noise caused by DAC non-linearities is essentially eliminated in normal operation. After the nonlinearities have been calibrated, the gain errors and DC offsets are calibrated in accordance with the overall calibration scheme described above with reference to FIG. 1.

In summary, there has been provided a method for calibrating the nonlinearities in a multi-level delta-sigma modulator. The delta-sigma modulator includes a multi-level feedback DAC that has inherent linearities. The non-linearities are compensated for by altering the driving levels that are input to the digital filter section. With an m-level DAC, only m−2 of the m-levels need to be compensated for in order to calibrate out the nonlinearities in the delta-sigma modulator. During the calibration procedure, the input of the delta-sigma modulator is set to zero and the value of the variable parameters input to the digital filter sections varied to minimize the errors. This value is then frozen and, in normal operation, the value is utilized to compensate one of the levels in the input to the digital filter section. This procedure requires no a priori knowledge of the DAC non-linearity.

Although the preferred embodiment has been described in detail, it should be understood that various changes, substitutions and alterations can be made therein without departing from the spirit and scope of the invention as defined by the appended claims.

What is claimed is:

1. A calibrated analog-to-digital converter, comprising:
   a delta-sigma analog modulator for converting an analog input signal to an m-level digital output signal representing the analog input signal at a sampling rate, said delta-sigma modulator having non-linearities associated therewith;
   a digital decimation filter driven by the m-level output of said delta-sigma modulator for filtering out-of-band frequency components and outputting a filtered digital value at a decimated sampling rate, said digital filter operating in accordance with stored filter coefficients;
   a memory device for storing said filter coefficients and also for storing non-linearity compensation parameters;
   a non-linearity compensation device for controlling said digital filter to compensate for non-linearities in said delta-sigma modulator in accordance, with said stored non-linearity compensation parameters; and
   a calibration device for operating said delta-sigma analog modulator and said digital filter in a calibration mode and determining said non-linearity compensation parameters for storage in said memory device.

2. The analog-to-digital converter of claim 1, wherein the value of m is equal to three.

3. The analog-to-digital converter of claim 1, wherein said compensation device is operable to vary m−2 of the m-levels output by said delta-sigma modulator that drive said digital filter, said m−2 compensated m-levels compensated in accordance with said stored non-linearity compensation parameters.

4. The analog-to-digital converter of claim 1, wherein said delta-sigma analog modulator comprises:
   a loop filter for receiving the input signal and processing the difference between the input signal and a feedback DAC signal to provide a filtered signal;
   a multi-level quantizer having m−1 quantizer threshold voltages, said quantizer operable to receive the output of said loop filter and output an m-level quantizer value; and
   an m-level digital-to-analog converter for receiving on the output thereof the output of said quantizer, the output thereof providing the feedback DAC signal for input to said loop filter.

5. The analog-to-digital converter of claim 4, wherein the value of m is equal to three.

6. The analog-to-digital converter of claim 1, wherein the value of m is equal to three, with the output of said delta-sigma analog modulator comprising a −1 level, a do nothing level and a +1 level, said digital filter comprising:
   first and second processors associated with the +1 level and the −1 level, respectively, each of said processors for receiving said stored filter coefficients and providing a set of accumulated filter coefficients that are accumulated as a function of the associated level being output from said delta-sigma analog modulator;
   a summation device for summing the difference between the output of said first and second processors at the decimated sampling rate; and
   said compensation device operable to compensate the output of one of said first and second processors at the decimated sampling rate prior to input to said summation device in accordance with said non-linearity compensation parameters.

7. The analog-to-digital converter of claim 1, wherein said calibration device operates in response to receiving a calibration signal, said calibration device operable to change from a normal operation mode to said calibration mode and, after determining said non-linearity compensation parameters, storing said determined non-linearity compensation parameters in said memory and then changing back to said normal operation mode.

8. The analog-to-digital converter of claim 7, wherein said calibration is an external calibration that is externally generated.

9. The analog-to-digital converter of claim 1, wherein said calibration device comprises:
   a calibration multiplexer for driving the input signal to a zero level;
   a non-linearity parameter adaptive processor for comparing the output of said digital filter with a desired value to define an error and iteratively changing the value of said non-linearity compensation parameters until said error meets predetermined criteria; and
   said adaptive processor operable to store said memory the value of said non-linearity compensation parameters that resulted in the error meeting said predetermined criteria.

10. The analog-to-digital converter of claim 1, wherein said digital filter comprises:
    a plurality of processors, each associated with a select one of at least two of the m-levels, each of said processors for receiving said stored filter coefficients and providing a set of accumulated filter coefficients that are accumulated as a function of the associated level being output from said delta-sigma analog modulator;
    a summation device for summing the difference between the output of said processors at the decimated sampling rate; and
    said non-linearity compensation device operable to compensate the output of one of said processors at the predetermined sampling rate prior to input to said summation device in accordance with said non-linearity compensation parameters.

11. A calibrated analog-to-digital converter, comprising:
    a delta-sigma analog modulator for converting an analog input signal to an m-level digital output signal representing the analog input signal at a sampling rate, said delta-sigma modulator having non-linearities associated therewith;
    a digital decimation filter driven by the m-level output of said delta-sigma modulator for filtering outof-band frequency components and outputting a filtered digital value at a decimated sampling rate, said digital filter operating in accordance with stored filter coefficients;

a memory device for storing said filter coefficients and also for storing non-linearity compensation parameters; and a non-linearity compensation device for controlling said digital filter to compensate for non-linearities in said delta-sigma modulator, said compensation device operating at the decimated sampling rate in accordance with said stored non-linearity compensation parameters.

12. The analog-to-digital converter of claim 11, wherein the value of m is equal to three.

13. The analog-to-digital converter of claim 11, wherein said compensation device is operable to vary $m-2$ of the m-levels output by said delta-sigma modulator that drive said digital filter, said $m-2$ compensated m-levels compensated in accordance with said stored non-linearity compensation parameters.

14. The analog-to-digital converter of claim 11, wherein said delta-sigma analog modulator comprises:

a loop filter for receiving the input signal and processing the difference between the input signal and a feedback DAC signal to provide a filtered signal;

a multi-level quantizer having $m-1$ quantizer threshold voltages, said quantizer operable to receive the output of said loop filter and output an m-level quantizer value; and an m-level digital-to-analog converter for receiving on the output thereof the output of said quantizer, the output thereof providing the feedback DAC signal for input to said loop filter.

15. The analog-to-digital converter to claim 14, wherein the value of m is equal to three.

16. The analog-to-digital converter of claim 11, wherein the value of m is equal to three, with the output of said delta-sigma analog modulator comprising a $-1$ level, a do nothing level and $+1$ level, said digital filter comprising:

first and second processors associated with the 30 1 level and the $-1$ level, respectively, each of said first and second processors for receiving said stored filter coefficients and providing a set of accumulated filter coefficients that are accumulated as a function of the associated level being output from said delta-sigma analog modulator;

a summation device for summing the difference between the output of said first and second processors at the decimated sampling rate; and said non-linearity compensation device operable to compensate the output of one of said first and second processors at the decimated sampling rate prior to input to said summation device in accordance with said non-linearity compensation parameters.

17. The analog-to-digital converter of claim 11, and further comprising a calibration device for determining said non-linearity compensation parameters for storage in said memory in response to receiving a calibration signal, said calibration device operable to change from a normal operation mode to a calibration mode and, after determining said non-linearity compensation parameters, storing said determined non-linearity compensation parameters in said memory and then changing back to said normal operation mode.

18. The analog-to-digital converter of claim 17, wherein said calibration device comprises:

a calibration multiplexer for driving the input signal to a zero level;

a non-linearity parameter adaptive processor for comparing the output of said digital filter with a desired value to define an error and iteratively changing the value of said non-linearity compensation parameters until said error is below a predetermined value; and said adaptive processor operable to store in said memory the value of said non-linearity compensation parameters that resulted in the error falling below said predetermined value.

19. The analog-to-digital converter of claim 17, wherein said calibration signal is an external calibration signal that is externally generated.

20. The analog-to-digital converter of claim 11, wherein said digital filter comprises:

a plurality of processors, each associated with a select one of at least two of the m-levels, each of said processors for receiving said stored filter coefficients and providing a set of accumulated filter coefficients that are accumulated as a function of the associated level being output from said delta-sigma analog modulator;

a summation device for summing the difference between the output of said processors at the decimated sampling rate; and said non-linearity compensation device operable to compensate the output of one of said processors at the decimated sampling rate prior to input to said summation device in accordance with said non-linearity compensation parameters.

21. A method for performing an analog-to-digital conversion on an input signal and compensating for non-linearities in the conversion process, comprising the steps of:

converting an analog input signal to an m-level digital output signal in a conversion process, the digital output signal representing the analog input signal at a sampling frequency, the step of converting having non-linearities associated therewith;

providing a digital decimation filter that is operable to filter out-of-band frequency components to output a filtered digital value at a decimated sampling frequency;

storing in a memory filter coefficients and non-linearity compensation parameters;

filtering the m-level output of the conversion process with the digital filter to provide the digital output;

compensating the non-linearities in the conversion process by controlling the digital filter to compensate for the non-linearities in the conversion process in accordance with the stored non-linearity compensation parameters; and operating the converting and filtering steps in a calibration mode and determining the non-linearity compensation parameters for storage in the memory.

22. The method of claim 21, wherein the step of compensating comprises compensating the values of $m-2$ of the m-levels output by the conversion process that are utilized to drive the digital filter.

23. The method of claim 21, wherein the step of converting comprises the steps of:

receiving the input signal and performing a loop filter operation thereon to process the difference between the input signal and a feedback DAC signal to provide a filtered signal;

providing a quantizer having m−1 threshold voltages, and quantizing the filtered signal to output an m-level quantizer value that comprises the m-level digital output;

converting the m-level quantizer value to an analog value with an m-level analog-to-digital converter to provide the feedback DAC signal; and subtracting the feedback DAC signal from the input signal prior to processing thereof by the loop filter.

24. The method of claim 23, wherein the value of m is equal to three.

25. The method of claim 24, wherein the step of determining comprises the steps of:

driving the input signal to a zero level;

comparing the output of the digital filter with a desired value to define an error and iteratively changing the value of the non-linearity compensation parameters until the error is less than a pre-determined value; and storing in the memory the value of the non-linearity compensation parameters that are present in the iteration operation after the error has become less than the predetermined value.

26. The method of claim 21, wherein the value of m is equal to three with the m-level digital output comprising a −1 level, a do nothing level and a +1 level, wherein the step of filtering comprises:

processing the +1 level and the −1 level with first and second processing steps, respectively, each of the first and second processing steps for receiving the stored coefficients and providing a set of accumulated filter coefficients that are accumulated as a function of the associated level being output from the step of converting;

summing the difference between the first and second processing steps at the decimated sampling rate; and the step of compensating operable to compensate the output of the first processing step at the decimated sampling rate prior to summation of the difference between the first and second processing steps in accordance with the stored non-linearity compensation parameters.

27. The method of claim 21, wherein the step of determining the non-linearity compensation parameters operates in response to receiving a calibration signal, the step of determining operable to first change the operation mode from a normal operation mode to the calibration mode and, after determining the non-linearity compensation parameters, storing the determined non-linearity compensation parameters in the memory and then changing from the calibration mode to the normal operation mode.

28. The method of claim 27, wherein the step of receiving the calibration signal comprises receiving an externally generated calibration signal.

29. A method for performing an analog-to-digital conversion on an input signal and compensating for non-linearities in the conversion process, comprising the steps of:

converting an analog input signal to an m-level digital output signal in a conversion process, the digital signal representing the analog input signal at a sampling frequency, the step of converting having non-linearities associated therewith;

providing a digital decimation filter that is operable to filter out-of-band frequency components to output a filtered digital value at a decimated sampling frequency;

storing in a memory filter coefficients and non-linearity compensation parameters;

filtering the m-level output of the conversion process with the digital filter to provide the digital output; and compensating the non-linearities in the conversion process by controlling the digital filter to compensate for the non-linearities in the conversion process at the decimated sampling rate in accordance with the stored non-linearity compensation parameters.

30. The method of claim 29, wherein the value of m is equal to three with the m-level digital output comprising a −1 level, a do nothing level and a +1 level, wherein the step of filtering comprises:

processing the +1 level and the −1 with first and second processing steps, respectively, each of the first and second processing steps for receiving the stored filter coefficients and providing a set of accumulated filter coefficients that are accumulated as a function of the associated level being output from the step of converting;

summing the difference between the first and second processing steps at the decimated sampling rate; and the step of compensating operable to compensate the output of the first processing step at the decimated sampling rate prior to summation of the difference between the first and second processing steps in accordance with the stored non-linearity compensation parameters.

31. The method of claim 30, and further comprising the step of determining the non-linearity compensation parameters in response to receiving a calibration signal, the step of determining operable to first change the operation mode from a normal operation mode to a calibration mode and, after determining the non-linearity compensation parameters, storing the determined non-linearity compensation parameters in the memory and then changing from the calibration mode to the normal operation mode.

32. The method of claim 31, wherein the step of receiving the calibration signal comprises receiving an externally generated calibration signal.

33. The method of claim 31, wherein the step of determining comprises the steps of:

driving the input signal to a zero level;

comparing the output of the digital filter with a desired value to define an error and iteratively changing the value of the non-linearity compensation parameters until the error is less than a pre-determined value; and storing in the memory the value of the non-linearity compensation parameters that are present in the iteration after the error has become less than the predetermined value.

* * * * *